United States Patent
Lowell

[11] Patent Number: 5,891,743
[45] Date of Patent: Apr. 6, 1999

[54] METHOD OF FORMING BURIED OXYGEN LAYER USING MEV ION IMPLANTATION

[75] Inventor: John K. Lowell, Round Rock, Tex.

[73] Assignee: Advanced Micro Device Inc., Sunnyvale, Calif.

[21] Appl. No.: 773,769

[22] Filed: Dec. 24, 1996

Related U.S. Application Data

[62] Division of Ser. No. 575,750, Dec. 20, 1995, abandoned, which is a continuation of Ser. No. 355,298, Dec. 12, 1994, abandoned.

[51] Int. Cl.$^6$ .................................................. H01L 21/265
[52] U.S. Cl. ............................... 437/24; 437/27; 437/11; 437/26; 437/21; 437/939
[58] Field of Search ................................. 437/24, 27, 11, 437/26, 21, 939

[56] References Cited

U.S. PATENT DOCUMENTS

| | | | |
|---|---|---|---|
| 3,622,382 | 11/1971 | Brack et al. | 437/63 |
| 4,151,007 | 4/1979 | Levinstein et al. | 148/1.5 |
| 4,371,420 | 2/1983 | Stevenson | 156/624 |
| 4,522,657 | 6/1985 | Rohatgi et al. | 148/1.5 |
| 5,229,311 | 7/1993 | Lai et al. | 437/43 |

OTHER PUBLICATIONS

M. Tamura et al., Damage Formation and Annealing of High Energy Ion Implantation in Si, Published in Nuclear Instruments and Methods in Physics Research, vol. B39, Nos. 1–4 Mar. 1989.

M. Tamura et al., Damage Formation and Annealing of High Energy Ion Implantation in Si, chemical Abstracts, vol. III, 1989, pp. 757.

Ghandi, VLSI Fabrication Principles, Wiley & Sons, 1983.

Wolf et al., vol. I, Silicon Processing for the VLSI Era, Lattice Press, 1986.

G. Galvagno et al., AI–O Interactions in Ion–Implanted Crystalline Silicon, Journal of Applied Physics, vol. 76, No. 4, 15 Aug. 1994, pp. 2070–2077.

*Primary Examiner*—Charles L. Bowers, Jr.
*Assistant Examiner*—Lynne A. Gurley
*Attorney, Agent, or Firm*—Foley & Lardner

[57] ABSTRACT

A method of manufacturing a wafer having a buried oxide layer at a desired depth is disclosed. The method includes the steps of implanting a standard species ion at an energy at or above 1 MeV into an oxygen-rich wafer to form a defect region at the desired depth in the oxygen rich wafer. The wafer is annealed such that oxygen in the wafer is gettered to the defect region to form the buried oxide layer.

7 Claims, 6 Drawing Sheets

METHOD OF FORMING BURIED OXYGEN LAYER USING MEV ION IMPLANTATION

This application is a divisional, of application Ser. No. 08/575,750, filed Dec. 20, 1995 now abandoned, which is a continuation of application Ser. No. 08/355,298, filed Dec. 12, 1994 now abandoned.

BACKGROUND OF THE INVENTION

The instant invention is directed to the manufacture of a silicon on insulator (SOI) wafer, and more particularly to a method of producing an SOI wafer having a buried oxide layer at a lower cost and which is also more reliable than conventionally known wafers. According to the method of the invention, such an SOI wafer can be produced using standard equipment in a normal production facility.

SOI wafers having buried oxide layers are an attractive technology for deep-submicron CMOS and radiation-hardened devices because the buried oxide layer offers both device isolation and the ability to getter defects, such as oxygen and metallic ions, away from the operating region of the device.

Figure 1A:
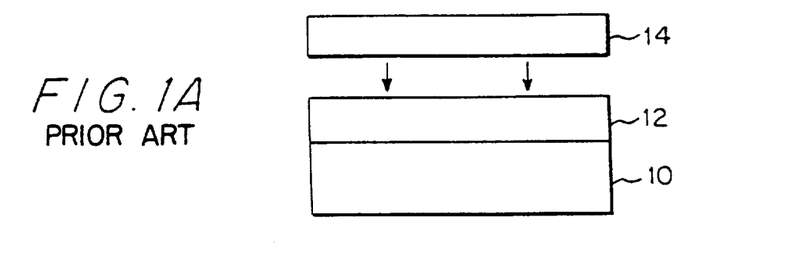
FIGS. 1A–1B illustrate the process used to manufacture an SOI wafer according to conventional techniques.

There are generally two conventional methods for producing SOI wafers. The first is SIBOND. With SIBOND wafers, as illustrated in FIG. 1A, an oxide layer 12 is formed on the surface of a substrate 10. A second silicon wafer 14 is bonded to the top surface of the oxide layer 12. Using this method, the top wafer 14 must be formed relatively thin so that the oxide layer 12 is at the desired depth to achieve the device isolation. This results, in an increased potential for defects as the thin layer is worked. Another drawback to the SIBOND wafer is manufacturing cost. Moreover, due to the complexity of the manufacturing process, the SOI wafer cannot be incorporated into the "in-house" production of a semiconductor device. Instead, the SOI wafer must be purchased from an outside source.

The second method employed to produce SOI wafers is SIMOX (i.e., Separation by Implanted Oxygen). In SIMOX technology, as illustrate in FIG. 1B, oxygen 16 is implanted into the substrate 10 at relatively low energies to form the buried oxide layer 13. As with SIBOND, one drawback for a semiconductor device manufacturer who wishes to use conventional SIMOX wafers is that the equipment need to produce such wafers is not of the type normally used in manufacturing semiconductor devices. Thus, typically SIMOX wafers must also be purchased from an outside source. Accordingly the costs of using SOI wafers is increased.

Figure 1B:
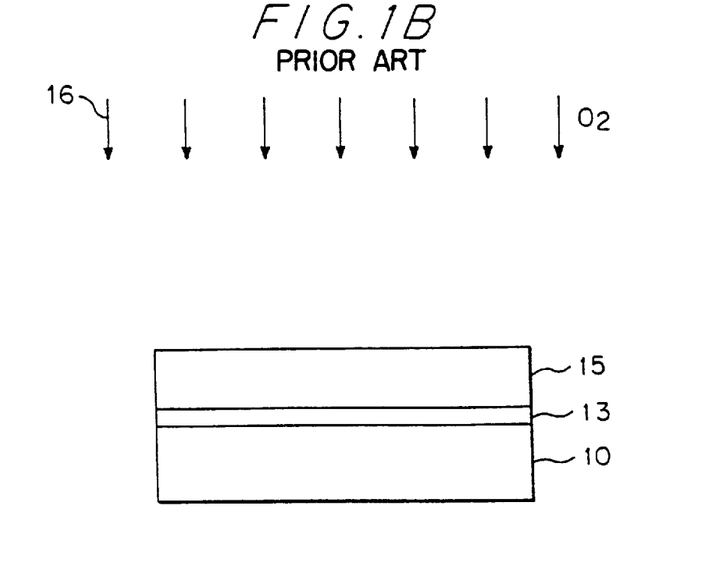

Another drawback associated with SIMOX wafers arises from the Oxygen implantation process itself. The oxygen implantation is carried out at relatively low energy levels, which tends to form defect regions in the surface of the wafer down to the buried oxide layer 13 through portion 15 of the substrate 10. Moreover, SIMOX wafers are typically considered "dirty", in the sense that significant amounts of iron impurities are introduced into the wafer during oxygen implantation. Since oxygen is not a standard species for ion implantation, the implanting device must be configured in a way which introduces these unwanted impurities. One of the downsides of using SIMOX wafers is that the iron rich nature of the wafer will significantly hinder the production and/or operation of most semiconductor devices. Moreover, the oxygen implantation step is not practical for implementation in standard device production facilities as part of the manufacturing process.

Accordingly it is an object of the instant invention to produce an SOI wafer which includes a buried oxide layer but which can be made using the type of equipment typically used by semiconductor manufacturers and to reduce the costs associated with making and using SOI wafers.

Another object of the instant invention is to provide a method for producing SOI or SOI like wafers which can be implemented in standard semiconductor device manufacturing processes.

Still another object of the instant invention is to produce an SOI wafer which is more reliable and does not have the undesirable impurities associated with the conventional SOI wafers.

SUMMARY OF THE INVENTION

To achieve the above and other objects of the instant invention there is provided a method of manufacturing a wafer having a buried oxygen layer at a desired depth. The method includes the step of implanting an ion into at least a portion of an oxygen-rich wafer to form a defect region at the desired depth in the oxygen rich wafer. The implantation is carried out at an energy level at or above 1 MeV. The method according to the invention also includes the step of annealing the oxygen-rich wafer such that oxygen in the wafer is gettered to the defect region.

In one preferred embodiment of the invention phosphorous is used for the ion implantation at a dose between $4.5 \times 10^{14}/cm^2$ and $1 \times 10^{15}/cm^2$. The instant invention is used to produce an SOI wafer having a buried oxide layer at a desired depth.

BRIEF DESCRIPTION OF THE DRAWINGS

The instant invention can be understood from the following description of the invention and the attached drawings in which.

DETAILED DESCRIPTION OF THE PREFERRED EMBODIMENTS

Figure 2:
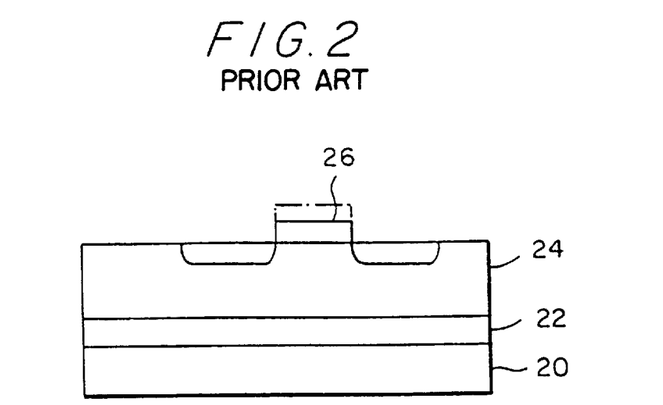
FIG. 2 illustrates a device using SOI technology.

FIG. 2 illustrates a device for which an SOI wafer manufactured according to the instant invention is to be used. In FIG. 2, a substrate 20 includes a buried oxide layer 22. On the upper portion 24 of the wafer above the oxide layer 22, a semiconductor device 26 is formed. This type of structure is particularly advantageous in CMOS logic in that it prevents parasitic latch-up. This type of structure is also advantageous for use in radiation hardened devices, as it prevents problems associated with α-particles of radiation.

Figure 3A:
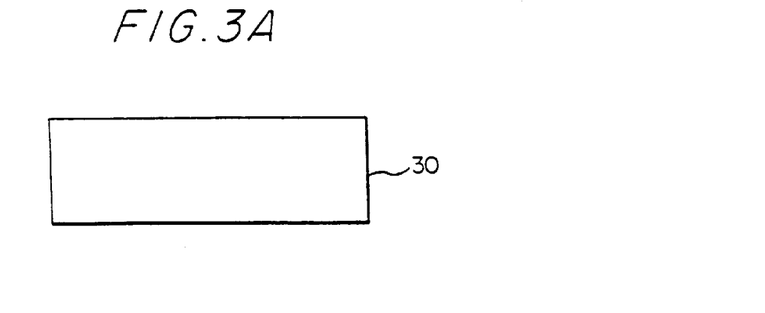
FIG. 3A–3C illustrates a method of producing an SOI wafer according to an embodiment of the invention.
Figure 3B:
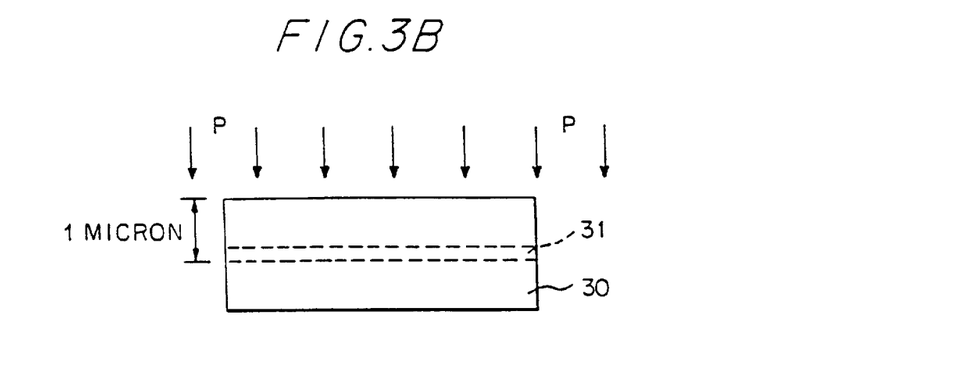
Figure 3C:
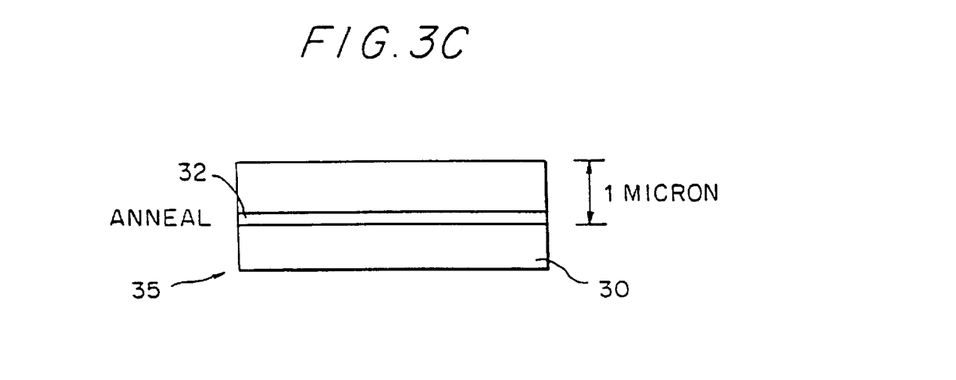

FIGS. 3A–3C illustrate a method for producing an SOI wafer according to an embodiment of the instant invention. In this embodiment, a standard P-type (100) wafer which is grown in an oxygen-rich (e.g. approximately $1 \times 10^{18} cm_3$) is provided as shown in FIG. 3A. As illustrated in FIG. 3B, the oxygen-rich wafer is implanted with a standard species, in this case phosphorous (P), at an energy level of at least 1 MeV. While phosphorous is used in the example provided below, the instant invention is not limited to phosphorous. Any standard species which generates the desired defect region could be used. Typically, having ions (relative to phosphorous) such as Arsenic can most easily be used to produce the desired effect. For lighter ions, such as boron, energy and dosage may need to be adjusted upward to account for lighter ion. It is also noted that the implantation step could be carried out through an oxide layer (not shown) on the surface of wafer 35. The dosage of the phosphorous implant can be varied according to the desired effect. In the specific examples provided below, the doses were varied between approximately $5 \times 10^{14} cm^2$ to $1 \times 10^{15} cm^2$.

The high energy phosphorous implantation of FIG. 3B creates a zone of defects 31 as a function of the phosphorous implant. In the depicted example, the zone of defects 31 is approximately 1 micron beneath the surface of the wafer 35. Since the implantation energy is relatively high, the zone of defects 31 are formed as an amorphous layer roughly about 1 micron deep. The defect zone is not formed from the surface down to the region 31 (at 1 micron) as would be seen in conventional SIMOX oxygen implantation illustrated in FIG. 1B. This is because a higher implantation energy is used as compared to the energy used for SIMOX oxygen implantation.

After the phosphorous implantation step is carried out, the wafer 35, including the zone of defects 31, is subjected to a 30-minute 960° annealing process. As a result of the annealing process carried out in FIG. 3C, the oxygen within the oxygen rich wafer 30 is drawn to the defects in the zone of defects 31. In other words, the background oxygen of the wafer 35 is drawn from both near the surface and from the bulk. Upon completion of the annealing process of FIG. 3C, a zone of oxygen is collected where the defects 31 were formed. As a result, an SOI wafer including a buried oxide layer 32 at a depth of approximately 1 micron is formed. In this manner, during the annealing step, the oxygen is gettered to the defects created by the phosphorous implant in order to produce a buried oxide layer.

Figure 4A:
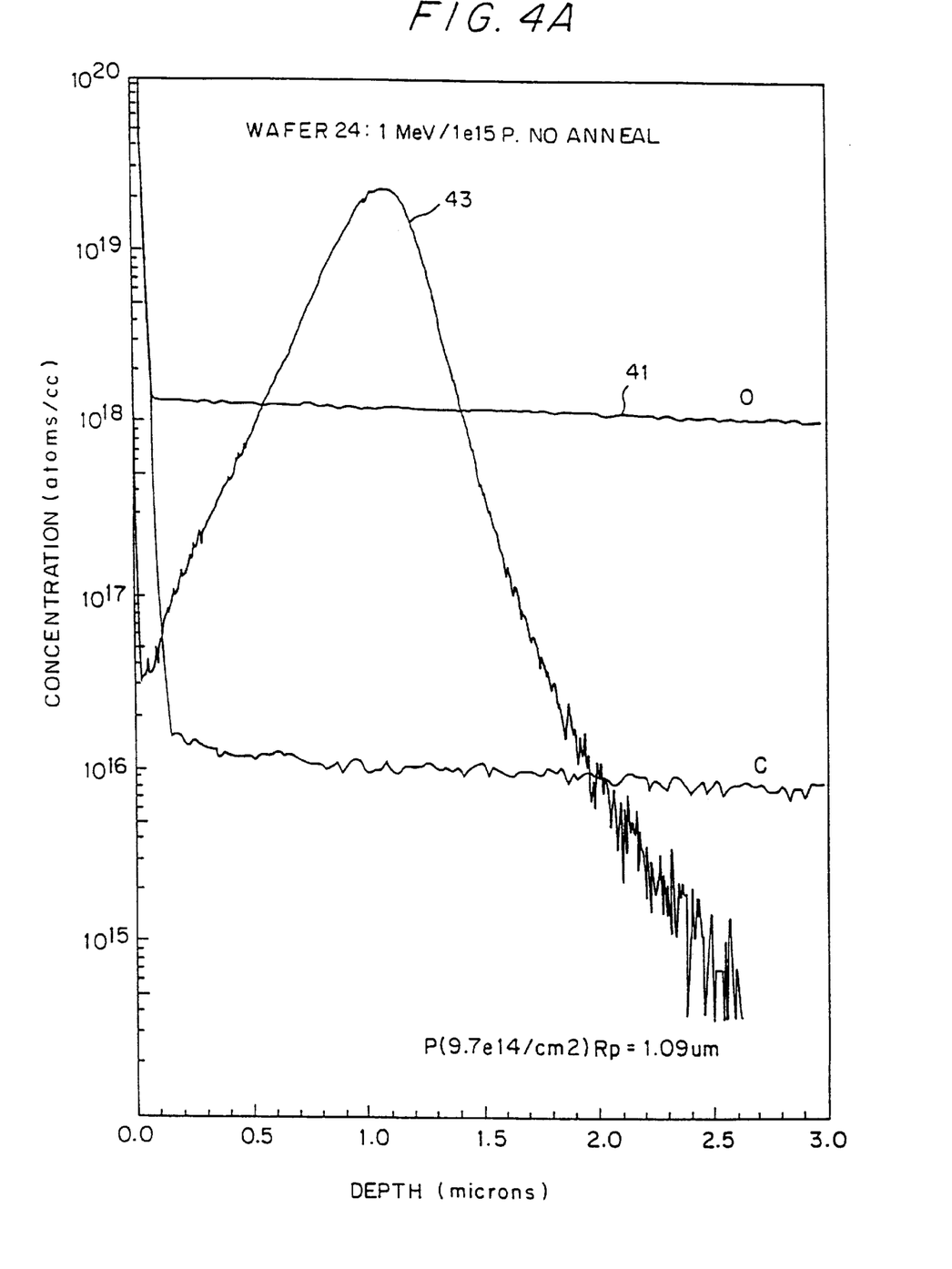
FIGS. 4A–4D illustrate SIMS profiles of various wafers illustrating the features of the instant invention.

FIGS. 4A–4D illustrate SIMS profiles which illustrate features of the above described process for manufacturing an SOI wafer. FIG. 4A shows a SIMS profile of the oxygen-rich wafer directly after a $1 \times 10^{15} cm^2$ phosphorous implant at 1 MeV was carried out in the manner illustrated in FIG. 3B. The SIMS profile of FIG. 4A illustrates the properties of a wafer before the annealing step illustrated in FIG. 3C is carried out. As can be seen in FIG. 4A, the background oxygen level 41 of the wafer is approximately $1 \times 10^{18}$ atoms/$cm^2$. The location of the phosphorous implant 43 is also evident. Notably, FIG. 4A also illustrates the absence of any buried oxygen layers within the wafer.

Figure 4B:
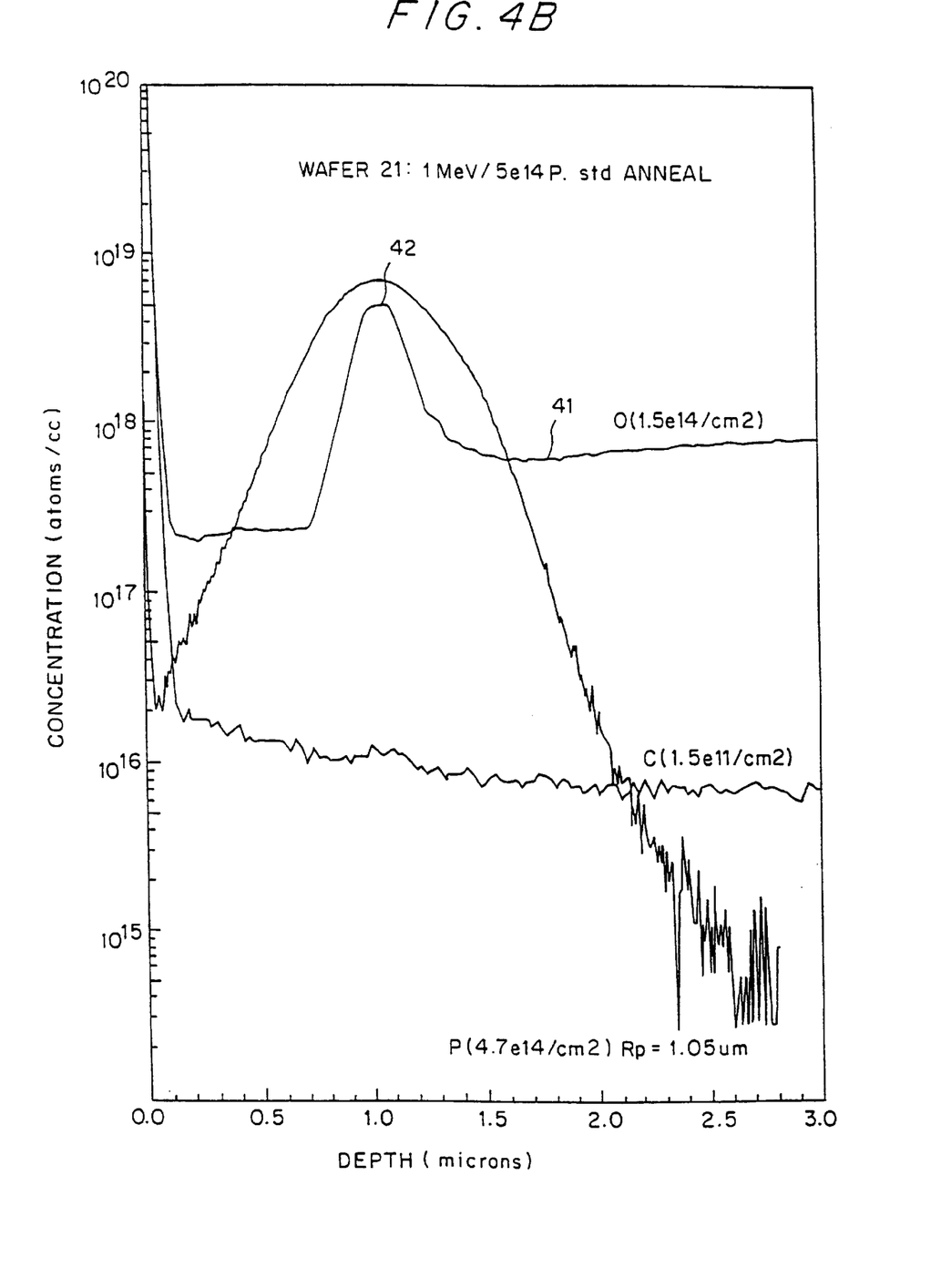
Figure 4C:
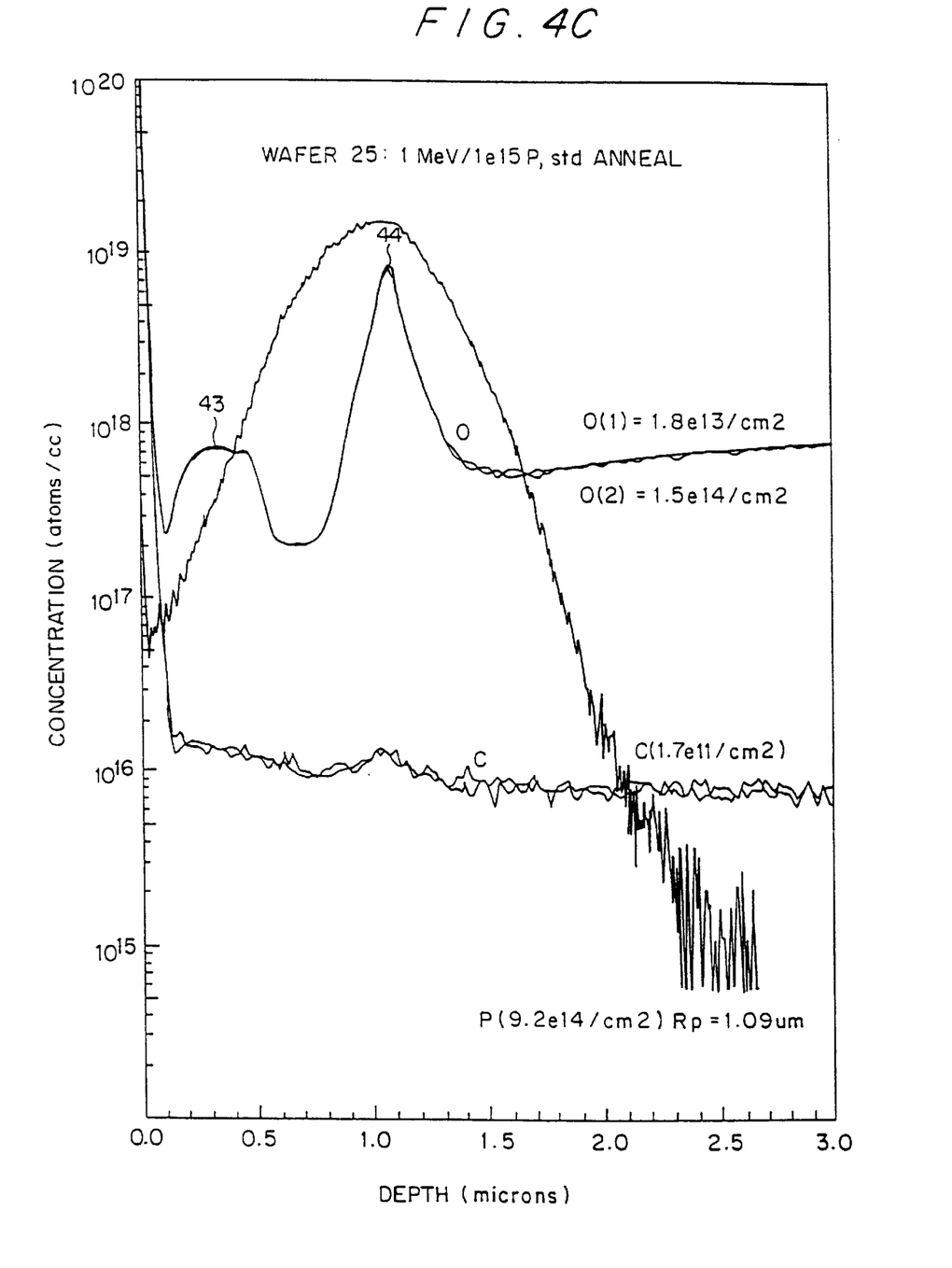

FIGS. 4B and 4C illustrate wafers manufactured according to the instant invention after the annealing step of FIG. 3C is carried out on implants of phosphorous at dosages of approximately $5 \times 10^{14} cm^2$ and $1 \times 10^{15} cm^2$, respectively. As illustrated in FIG. 4B at a dosage of $5 \times 10^{14}$ a distinct oxide layer is formed at the oxygen peak 42 approximately 1 micron deep. This layer is approximately 0.5 microns wide and has a peak level of $5 \times 10^{18} cm^3$. As further illustrated by comparing FIG. 4B with FIG. 4A, the surrounding oxygen has been gettered in the production of the oxygen peak 42.

FIG. 4C illustrates a SIMS profile of a wafer after the annealing step which was implanted with phosphorous at a level of approximately $1 \times 10^{15} cm^2$. As illustrated in FIG. 4C this process produced two oxygen peaks 43 and 44 at approximately 0.3 and 1.0 microns, respectively. The first oxygen peak 44 is similar to the oxygen peak 42 in FIG. 4B. The second peak 43 is produced as a result of the phosphorous implant at the higher dosage which knocks oxygen from the surface into the substrate. In other words, some of the oxygen at the surface is knocked into the substrate by the phosphorous. This effect is even more pronounced when the phosphorous implant is carried out through an oxide layer on the surface of the substrate. In this case, oxygen from the oxide layer is knocked deeper into the substrate to produce the second oxygen peak 43. Unlike the first oxygen peak, the second oxygen peak is not the result of defects created by the phosphorous implant, but rather is a result of oxygen actually moved from the surface to that region. This will be more fully understood from the description of the interferometry results described below.

Figure 4D:
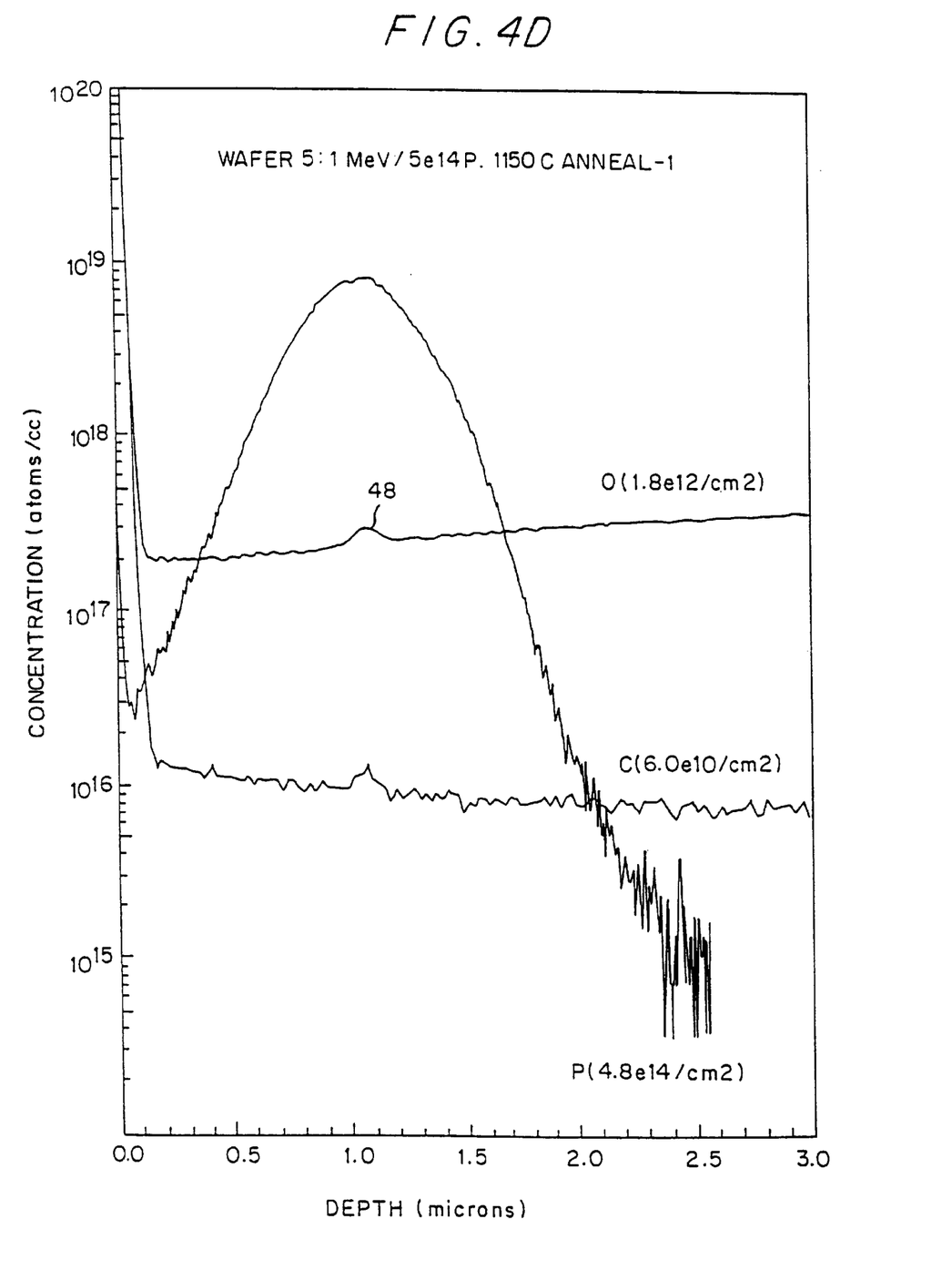

In FIG. 4D, a wafer is shown wherein phosphorous was implanted at a dose of $5 \times 10^{14} cm^2$ at approximately 1 MeV. In this case, prior to the annealing step illustrated in FIG. 3C, the wafer is subjected to an $H_2$ 15 minute 1,150° annealing treatment. When the $H_2$ treatment is carried out prior to the annealing step illustrated in FIG. 3C, significant oxygen layers are not formed within the wafer. A slight oxygen peak 48 can be seen. However, this oxygen peak is not at a significant level. Thus, the $H_2$ anneal can be used to essentially prohibit the formation of the oxide layer (i.e., when it is desired that the oxygen not be gettered to the defect zone, an $H_2$ treatment can be carried out in order to push the oxygen towards the bottom of the substrate).

In the above described manner, an $H_2$ anneal can be used along with the phosphorous implant in a standard production line. Thus, when it is desired to run the phosphorous implant, but not to create an SOI on some wafers, an $H_2$ treatment could be carried out prior to the annealing step. In other words, the production of an SOI type substrate could be selectively carried out. That is, the same implant could be carried out when it is desired to create the same junction, but if the buried $O_2$ layer was not desired, the hydrogen annealing step would be inserted between the steps illustrated in FIG. 3B and FIG. 3C. Thus, the instant method for producing an SOI wafer could be carried out in a production process as desired, without committing the entire production line to an SOI type wafer.

The wafers used to produce the SIMS profiles illustrated in FIGS. 4A–4D were subjected to an interferometric examination. The results provide a more complete explanation of the features of the instant invention. The results are illustrated in table 1 where the measured result indicates the presence of defects at approximately 1-micron deep.

TABLE 1

| Wafer | Measured result at 1-Micron |
|---|---|
| Wafer 24 (Figure 4A) | None |
| Wafer 21 (Figure 4B) | ≈1 |
| Wafer 25 (Figure 4C) | ≈1 |
| Wafer 5 (Figure 4D) | ≈1 |

As illustrated in the above table, the interferometric results demonstrate that in each of the instances except for wafer 24, a defect region is detected at the depth of approximately 1 micron. The results did not produce a defect region above the 1 micron region. It is noted that for wafer 24 while the defect region exists no oxide layer is formed at the 1 micron level in order to reflect and examine the defect region. While in wafer 5 (illustrated in FIG. 4D) only a small oxygen peak is formed, it is sufficient to examine the defect region. Thus, according to these results it can be understood that according to the method of the instant invention, an oxide layer buried within the SOI wafer can be formed. The formation of the oxide layer can also be controlled by controlling the phosphorous implantation and/or the level of the background oxygen layer. Moreover, formation can be inhibited with an $H_2$ anneal.

While the instant invention is described in connection with the embodiments set forth above, it should not be limited to the specifics of the embodiment. Variations of the instant method will be apparent to those of ordinary skill on the basis of the above teachings and examples. Thus, the instant invention is only limited by the appended claims.

What is claimed is:

1. A method of manufacturing a first oxygen-rich wafer having a buried oxygen layer at a first depth, the method comprising the steps of:

implanting a first plurality of ions into at least a portion of a first oxygen-rich wafer to form a defect region at the first depth in the first oxygen-rich wafer at an energy level at or above 1 MeV;

implanting a second plurality of ions into at least a portion of a second oxygen-rich wafer to form a defect region at the first depth in the second oxygen-rich wafer at the energy level at or above 1 MeV;

annealing the second oxygen-rich wafer with $H_2$; and annealing the first and second oxygen-rich wafers such that oxygen in the first oxygen-rich wafer is gettered to the defect region to form the buried oxygen layer, and oxygen is not gettered to the defect region of the second oxygen-rich wafer due to the $H_2$ annealing step performed for the second oxygen-rich wafer only.

2. A method as recited in claim 1, wherein each of the first and second plurality of ions is phosphorous.

3. A method as recited in claim 1, wherein the first and second plurality of ions are implanted in the implanting steps at a dose between approximately $4.5 \times 10^{14}/cm^2$ and $1 \times 10^{15}/cm^2$.

4. A method as recited in claim 1, further comprising the step of forming an oxygen layer on a top surface of the first and second oxygen-rich wafers prior to the implanting step.

5. A method as recited in claim 1, wherein the first annealing step is carried out at approximately 960° C. and for approximately 30 minutes, and the second annealing step is carried out at approximately 1,150° C. and for approximately 15 minutes.

6. A method as recited in claim 1, wherein the implanting of the first and second plurality of ions are performed at a dosage of about $1 \times 10^{18}/cm^2$ from above the first and second oxygen-rich wafers, wherein the first depth is defined with respect to a top surface of the first and second oxygen-rich wafers, respectively, and wherein the defect region of the first oxygen-rich wafer also includes oxygen pushed therein prior to the annealing step for the first oxygen-rich wafer due to the implantation of the first plurality of ions at the dosage level of about $1 \times 10^{15}/cm^2$.

7. A method as recited in claim 6, wherein the oxygen is pushed into the defect region of the first oxygen-rich wafer from an upper portion of the first oxygen-rich wafer, the upper portion including a region below a top surface of the first oxygen-rich wafer and above the first depth of the first oxygen-rich wafer.

* * * * *

UNITED STATES PATENT AND TRADEMARK OFFICE
CERTIFICATE OF CORRECTION

PATENT NO. : 5,891,743
DATED : April 6, 1999
INVENTOR(S) : John K. LOWELL

It is certified that error appears in the above-identified patent and that said Letters Patent is hereby corrected as shown below:

On the title page item [73],

Assignee name should read, --ADVANCED MICRO DEVICES INC.--.

Signed and Sealed this

Fourteenth Day of September, 1999

Attest:

Q. TODD DICKINSON

*Attesting Officer*      *Acting Commissioner of Patents and Trademarks*